(12) United States Patent
Chen et al.

(10) Patent No.: US 12,213,343 B2
(45) Date of Patent: Jan. 28, 2025

(54) DISPLAY PANEL AND MANUFACTURING METHOD THEREOF, AND DISPLAY DEVICE

(71) Applicant: BOE TECHNOLOGY GROUP CO., LTD., Beijing (CN)

(72) Inventors: Dengyun Chen, Beijing (CN); Hao Liu, Beijing (CN); Huijuan Zhang, Beijing (CN)

(73) Assignee: BOE Technology Group Co., Ltd., Beijing (CN)

(*) Notice: Subject to any disclaimer, the term of this patent is extended or adjusted under 35 U.S.C. 154(b) by 612 days.

(21) Appl. No.: 17/599,628

(22) PCT Filed: Dec. 23, 2020

(86) PCT No.: PCT/CN2020/138584
§ 371 (c)(1),
(2) Date: Sep. 29, 2021

(87) PCT Pub. No.: WO2022/133792
PCT Pub. Date: Jun. 30, 2022

(65) Prior Publication Data
US 2022/0399419 A1    Dec. 15, 2022

(51) Int. Cl.
*H10K 59/121* (2023.01)
*H10K 50/84* (2023.01)
(Continued)

(52) U.S. Cl.
CPC ......... *H10K 59/1213* (2023.02); *H10K 50/84* (2023.02); *H10K 59/1216* (2023.02);
(Continued)

(58) Field of Classification Search
CPC ............... H10K 59/122; H10K 59/173; H10K 59/10–221
See application file for complete search history.

(56) References Cited

U.S. PATENT DOCUMENTS

2013/0076646 A1    3/2013    Krah et al.
2018/0182901 A1    6/2018    Im et al.
(Continued)

FOREIGN PATENT DOCUMENTS

CN    203376699 U    1/2014
CN    107092118 A    8/2017
(Continued)

*Primary Examiner* — Evren Seven
*Assistant Examiner* — Cole Leon Lindsey
(74) *Attorney, Agent, or Firm* — The Webb Law Firm

(57) ABSTRACT

Provided are a display panel and a manufacturing method thereof, and a display device. The display panel includes: a base substrate including a display area and a peripheral area; sub-pixels located, at least one sub-pixel including a driving transistor including conductive layers; a first dam located at the peripheral area; a second dam located at the peripheral area and located on one side of the first dam away from the display area; an encapsulation layer, orthographic projections of the sub-pixels, the first and the second dam on the base substrate being located within that of the encapsulation layer; and at least one pressure sensor located on at least one of a first side of the second dam proximate to the first dam or a second side away from the first dam, wherein at least one resistor in each pressure sensor is located in a same layer as one conductive layer.

20 Claims, 6 Drawing Sheets

US 12,213,343 B2
Page 2

(51) Int. Cl.
   *H10K 59/12* (2023.01)
   *H10K 59/122* (2023.01)
   *H10K 59/131* (2023.01)
   *H10K 71/00* (2023.01)

(52) U.S. Cl.
   CPC ......... *H10K 59/122* (2023.02); *H10K 59/131* (2023.02); *H10K 71/00* (2023.02); *H10K 59/1201* (2023.02)

(56) References Cited

U.S. PATENT DOCUMENTS

| | | | |
|---|---|---|---|
| 2018/0188874 A1* | 7/2018 | Cho | G01L 1/18 |
| 2019/0306986 A1* | 10/2019 | Lee | H05K 1/183 |
| 2020/0020752 A1* | 1/2020 | Shi | H10K 50/844 |
| 2020/0042043 A1 | 2/2020 | Lee et al. | |
| 2020/0057545 A1 | 2/2020 | Seomoon et al. | |
| 2020/0142560 A1 | 5/2020 | Wang et al. | |
| 2021/0091164 A1* | 3/2021 | Kim | H10K 59/131 |
| 2021/0336208 A1* | 10/2021 | Liu | H10K 59/1201 |
| 2021/0359069 A1* | 11/2021 | Wang | H10K 77/10 |
| 2022/0053080 A1 | 2/2022 | Xu | |

FOREIGN PATENT DOCUMENTS

| | | | | |
|---|---|---|---|---|
| CN | 107390930 A | | 11/2017 | |
| CN | 107526480 A | | 12/2017 | |
| CN | 107561763 A | | 1/2018 | |
| CN | 107608556 A | | 1/2018 | |
| CN | 107731857 A | | 2/2018 | |
| CN | 107787476 A | | 3/2018 | |
| CN | 108268180 A | | 7/2018 | |
| CN | 109782944 A | | 5/2019 | |
| CN | 110381203 A | | 10/2019 | |
| CN | 110780762 A | | 2/2020 | |
| CN | 110798552 A | | 2/2020 | |
| CN | 110837311 A | | 2/2020 | |
| CN | 110908539 A | | 3/2020 | |
| CN | 112002828 A | | 11/2020 | |
| CN | 112436046 A | * | 3/2021 | ............... G09F 9/33 |
| KR | 1020180075783 A | | 7/2018 | |

* cited by examiner

DISPLAY PANEL AND MANUFACTURING METHOD THEREOF, AND DISPLAY DEVICE

CROSS-REFERENCE TO RELATED APPLICATION

The present application is a U.S. National Stage Application under 35 U.S.C. § 371 of International Patent Application No. PCT/CN2020/138584, filed on Dec. 23, 2020, the disclosure of which is incorporated by reference herein in its entirety.

TECHNICAL FIELD

The present disclosure relates to a display panel and a manufacturing method thereof, and a display device.

BACKGROUND

With the development of display technology, the organic light emitting diode (OLED) display panel has been widely applied. In the related art, in order to realize human-computer interaction, interaction buttons, for example, a volume button, or a power-on button needs to be additionally provided.

SUMMARY

According to one aspect of the embodiments of the present disclosure, a display panel is provided. The display panel comprises: a base substrate comprising a display area and a peripheral area surrounding the display area; a plurality of sub-pixels located at the display area, wherein at least one sub-pixel of the plurality of sub-pixels comprises a driving transistor comprising a plurality of conductive layers; a first dam surrounding the display area and located at the peripheral area; a second dam surrounding the display area, located at the peripheral area and located on one side of the first dam away from the display area; an encapsulation layer located on one side of the plurality of sub-pixels, the first dam, and the second dam away from the base substrate, wherein orthographic projections of the plurality of sub-pixels, the first dam, and the second dam on the base substrate are located within an orthographic projection of the encapsulation layer on the base substrate; and at least one pressure sensor located on at least one of a first side of the second dam proximate to the first dam or a second side of the second dam away from the first dam, wherein at least one resistor in each of the at least one pressure sensor is located in a same layer as one of the plurality of conductive layers.

In some embodiments, the driving transistor comprises: an active layer and a gate which are located on one side of the base substrate; a first insulating layer located between the active layer and the gate; a second insulating layer located on one side of the active layer, the gate and the first insulating layer away from the base substrate; a third insulating layer located on one side of the second insulating layer away from the base substrate; and a first electrode and a second electrode which are located on one side of the third insulating layer away from the base substrate and electrically connected to the active layer, wherein the plurality of conductive layers comprises the gate, the first electrode and the second electrode, and the at least one resistor, the first electrode and the second electrode are located in a same layer.

In some embodiments, the at least one sub-pixel further comprises a storage capacitor comprising: a first electrode plate located in a same layer as the gate, and a second electrode plate located between the second insulating layer and the third insulating layer; the at least one resistor comprises a first resistor electrically connected between a first input terminal and a first output terminal, a second resistor electrically connected between the first output terminal and a second input terminal, a third resistor electrically connected between the second input terminal and a second output terminal, and a fourth resistor electrically connected between the second output terminal and the first input terminal, wherein the first resistor, the second resistor, the third resistor and the fourth resistor are of a same resistance value in a case where no pressure is applied the first resistor, the second resistor, the third resistor and the fourth resistor; and the display panel further comprises a first signal output line electrically connected to the first output terminal and a second signal output line electrically connected to the second output terminal, wherein the first signal output line and the second signal output line are located in a same layer as one of the first electrode plate and the second electrode plate.

In some embodiments, the first signal output line and the second signal output line are located in a same layer as the second electrode plate.

In some embodiments, the display panel further comprises: a first signal input line electrically connected to the first input terminal; and a second signal input line electrically connected to the second input terminal, wherein the first signal input line and the second signal input line are located in a same layer as the other of the first electrode plate and the second electrode plate.

In some embodiments, the first resistance and the third resistance are arranged symmetrically with respect to a first line, and the second resistance and the fourth resistance are arranged symmetrically with respect to a second line.

In some embodiments, the first line is perpendicular to the second line.

In some embodiments, the first resistor is located on one side of the first line, and the second resistor, the third resistor, and the fourth resistor are located on the other side of the first line.

In some embodiments, the display panel further comprises: a crack stop member located on one side of the encapsulation layer away from the display area, wherein the at least one pressure sensor is located on one side of the crack stop member proximate to the display area.

In some embodiments, the at least one pressure sensor comprises: a first pressure sensor located between the second dam and the first dam, wherein an orthographic projection of the first pressure sensor on the base substrate is located within the orthographic projection of the encapsulation layer on the base substrate.

In some embodiments, the at least one pressure sensor comprises: a second pressure sensor located between the second dam and the crack stop member, wherein an orthographic projection of the second pressure sensor on the base substrate is located within the orthographic projection of the encapsulation layer on the base substrate.

In some embodiments, the at least one pressure sensor comprises: a third pressure sensor located between the encapsulation layer and the crack stop member.

In some embodiments, the display panel further comprises a buffer layer located between the base substrate and the first insulating layer, wherein: the first insulating layer, the second insulating layer, the third insulating layer, and the buffer layer extend from the display area to the peripheral area, and the crack stop member penetrates through the third insulating layer, the second insulating layer, the first insulating layer, and the buffer layer.

In some embodiments, the at least one sub-pixel further comprises: a planarization layer located on one side of the first electrode, the second electrode and the third insulating layer away from the base substrate, an anode located on one side of the planarization layer away from the base substrate and electrically connected to one of the first electrode and the second electrode, a pixel defining layer located on one side of the anode and the planarization layer away from the base substrate, and having a first opening, wherein an orthographic projection of the first opening on the base substrate at least partially overlaps with an orthographic projection of the anode on the base substrate, a functional layer at least partially located in the first opening and located on one side of the anode away from the base substrate, and a cathode at least partially located in the first opening and located on one side of the functional layer away from the base substrate; and the display panel further comprises a power bus located at the peripheral area, electrically connected to the cathode, and located in a same layer as the first electrode and the second electrode.

In some embodiments, the planarization layer has a second opening, the pixel defining layer further has a third opening, orthographic projections of the second opening and the third opening on the base substrate being located at the peripheral area; the display panel further comprises an electrical connection portion at least partially located in the second opening, located in a same layer as the anode, and in contact with the power bus; and the cathode is partially located in the third opening, and in contact with the electrical connection portion.

In some embodiments, the display panel further comprises: a plurality of initialization lines located at the display area, electrically connected to the plurality of sub-pixels, and configured to provide an initialization signal to the plurality of sub-pixels; and an initialization bus located at the peripheral area, located between the planarization layer and the base substrate, electrically connected to the plurality of initialization lines, and located in a same layer as the first electrode and the second electrode.

In some embodiments, the first dam comprises: a first layer located in a same layer as the planarization layer; and a second layer located on one side of the first layer away from the base substrate and located in a same layer as the pixel defining layer.

In some embodiments, the second dam comprises: a third layer located in a same layer as the planarization layer; a fourth layer located on one side of the third layer away from the base substrate, and located in a same layer as the pixel defining layer; and a fifth layer located on one side of the fourth layer away from the base substrate and located in a same layer as a support layer, wherein the support layer is located at the display area and located on one side of the pixel defining layer away from the base substrate.

According to another aspect of the embodiments of the present disclosure, provided is a display device, comprising the display panel according to any one of the above embodiments.

According to still another aspect of the embodiments of the present disclosure, provided is a manufacturing method of a display panel, comprising: providing a base substrate comprising a display area and a peripheral area surrounding the display area; forming a plurality of sub-pixels, a first dam, a second dam and at least one pressure sensor; wherein: the plurality of sub-pixels is located at the display area, and at least one sub-pixel of the plurality of sub-pixels comprises a driving transistor comprising a plurality of conductive layers, the first dam and the second dam are located at the peripheral area and surround the display area, and the second dam is located on one side of the first dam away from the display area, and the at least one pressure sensor is located on at least one of a first side of the second dam proximate to the first dam or a second side of the second dam away from the first dam, wherein at least one resistor in each of the at least one pressure sensor is located in a same layer as one of the plurality of conductive layers; and forming an encapsulation layer located on one side of the plurality of sub-pixels, the first dam, and the second dam away from the base substrate, wherein orthographic projections of the plurality of sub-pixels, the first dam, and the second dam on the base substrate are located within an orthographic projection of the encapsulation layer on the base substrate.

BRIEF DESCRIPTION OF THE DRAWINGS

The accompanying drawings which constitute part of this specification, illustrate the exemplary embodiments of the present disclosure, and together with this specification, serve to explain the principles of the present disclosure.

The present disclosure may be more explicitly understood from the following detailed description with reference to the accompanying drawings, in which.

Figure 1:
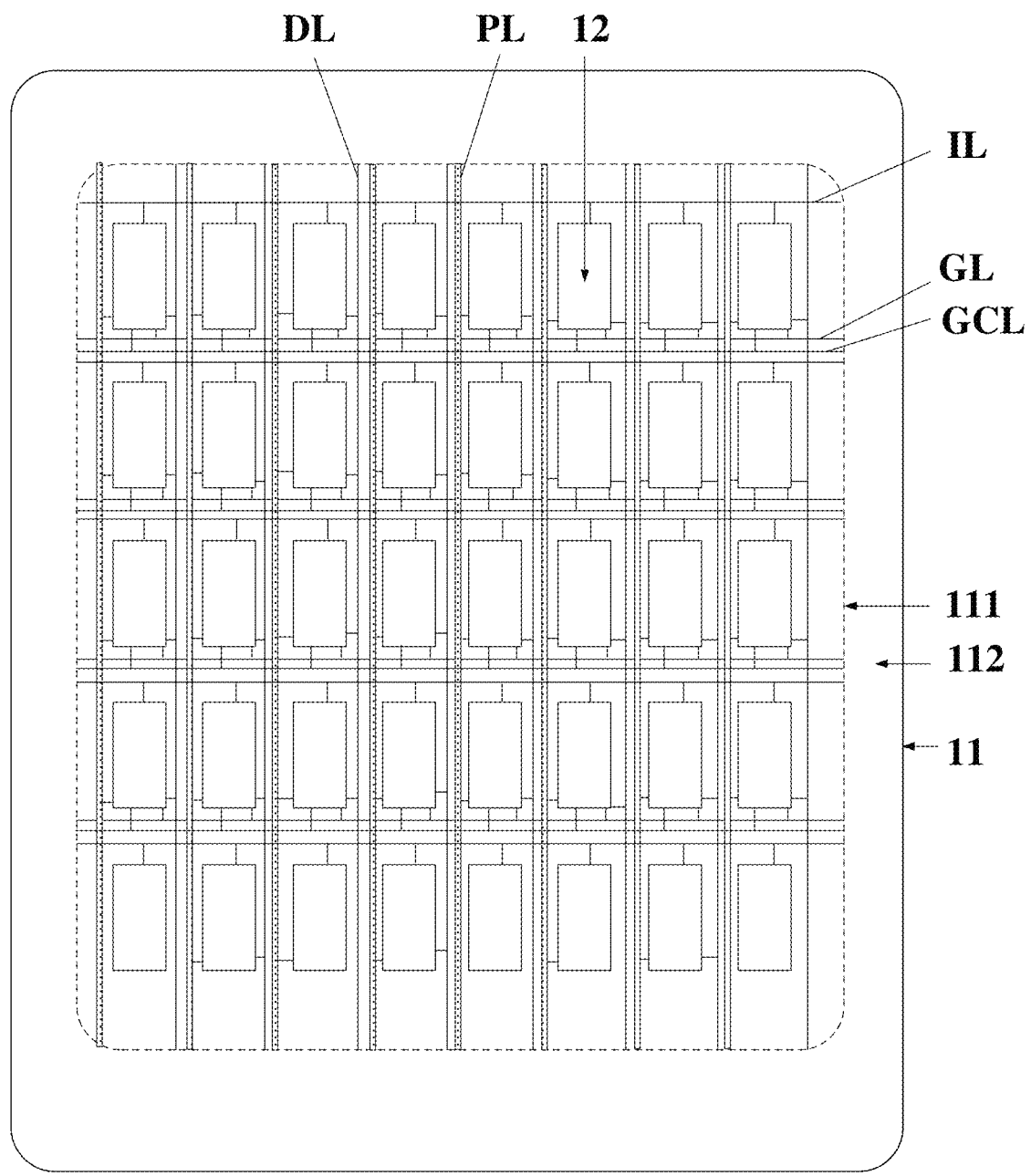
FIG. 1 is a schematic structure view showing a display panel according to an embodiment of the present disclosure.

It should be understood that the dimensions of various parts shown in the accompanying drawings are not necessarily drawn according to actual proportional relations. In addition, the same or similar components are denoted by the same or similar reference signs.

DETAILED DESCRIPTION

Various exemplary embodiments of the present disclosure will now be described in detail with reference to the accompanying drawings. The following description of the exemplary embodiments is merely illustrative and is in no way intended as a limitation to the present disclosure, its application or use. The present disclosure may be implemented in many different forms, which are not limited to the embodiments described herein. These embodiments are provided to make the present disclosure thorough and complete, and fully convey the scope of the present disclosure to those skilled in the art. It should be noticed that: relative arrangement of components and steps, material composition, numerical expressions, and numerical values set forth in these embodiments, unless specifically stated otherwise, should be explained as merely illustrative, and not as a limitation.

The use of the terms "first", "second" and similar words in the present disclosure do not denote any order, quantity or importance, but are merely used to distinguish between different parts. A word such as "comprise", "have" or variants thereof means that the element before the word covers the element(s) listed after the word without excluding the possibility of also covering other elements. The terms "up", "down", or the like are used only to represent a relative positional relationship, and the relative positional relationship may be changed correspondingly if the absolute position of the described object changes.

In the present disclosure, when it is described that a specific component is disposed between a first component and a second component, there may be an intervening component between the specific component and the first component or between the specific component and the second component. When it is described that a specific part is connected to other parts, the specific part may be directly connected to the other parts without an intervening part, or not directly connected to the other parts with an intervening part.

Unless otherwise defined, all terms (including technical and scientific terms) used herein have the same meanings as the meanings commonly understood by one of ordinary skill in the art to which the present disclosure belongs. It should also be understood that terms as defined in general dictionaries, unless explicitly defined herein, should be interpreted as having meanings that are consistent with their meanings in the context of the relevant art, and not to be interpreted in an idealized or extremely formalized sense.

Techniques, methods, and apparatus known to those of ordinary skill in the relevant art may not be discussed in detail, but where appropriate, these techniques, methods, and apparatuses should be considered as part of this specification.

FIG. 1 is a schematic structure view showing a display panel according to an embodiment of the present disclosure.

As shown in FIG. 1, the display panel comprises a base substrate 11 and a plurality of sub-pixels 12.

The base substrate 11 comprises a display area 111 and a peripheral area 112 surrounding the display area. In some embodiments, the base substrate 11 comprises a first base substrate layer, a second base substrate layer, a first barrier layer, and a second barrier layer. The first barrier layer is located between the first base substrate layer and the second base substrate layer, and the second base substrate layer is located between the first barrier layer and the second barrier layer. For example, the material of at least one of the first base substrate layer or the second base substrate layer may comprise a flexible material such as polyimide (PI). For example, the material of at least one of the first barrier layer or the second barrier layer may comprise an inorganic insulating material such as silicon oxide, silicon nitride, or silicon oxynitride.

The plurality of sub-pixels 12 is located at the display area 111. For example, the plurality of sub-pixels 12 may comprise a red sub-pixel, a green sub-pixel, or a blue sub-pixel. Each sub-pixel 12 comprises a pixel circuit. For example, the pixel circuit may comprise six transistors and one capacitor (6T1C). For another example, the pixel circuit may comprise seven transistors and one capacitor (7T1C).

In some embodiments, referring to FIG. 1, the display panel further comprises a plurality of data lines DL. The plurality of data lines DL is located at the display area 111 and electrically connected to the plurality of sub-pixels 12 located at the display area 111. The plurality of data lines DL is configured to provide a data signal to the plurality of sub-pixels 12. For example, each data line DL is electrically connected to a column of sub-pixels 12.

In some embodiments, referring to FIG. 1, the display panel further comprises a plurality of gate lines GL. The plurality of gate lines GL is located at the display area 111 and electrically connected to the plurality of sub-pixels 12. The plurality of gate lines GL is configured to provide a gate signal to the plurality of sub-pixels 12. For example, each gate line GL is electrically connected to a row of sub-pixels 12.

In some embodiments, referring to FIG. 1, the display panel further comprises a plurality of light emitting control lines GCL. The plurality of light emitting control lines GCL is located at the display area 111 and electrically connected to the plurality of sub-pixels 12. The plurality of light emitting control lines GCL is configured to provide a light emitting control signal to the plurality of sub-pixels 12. For example, each light emitting control line GCL is electrically connected to a row of sub-pixels 12.

In some embodiments, referring to FIG. 1, the display panel further comprises a plurality of power lines PL. The plurality of power lines PL is located at the display area 111 and electrically connected to the plurality of sub-pixels 12. The plurality of power lines 16 is configured to provide a power signal to the plurality of sub-pixels 12.

In some embodiments, referring to FIG. 1, the display panel further comprises a plurality of initialization lines IL. The plurality of initialization lines IL is located at the display area 111 and electrically connected to the plurality of sub-pixels 12. The plurality of initialization lines IL is configured to provide an initialization signal to the plurality of sub-pixels 12.

Figure 2A:
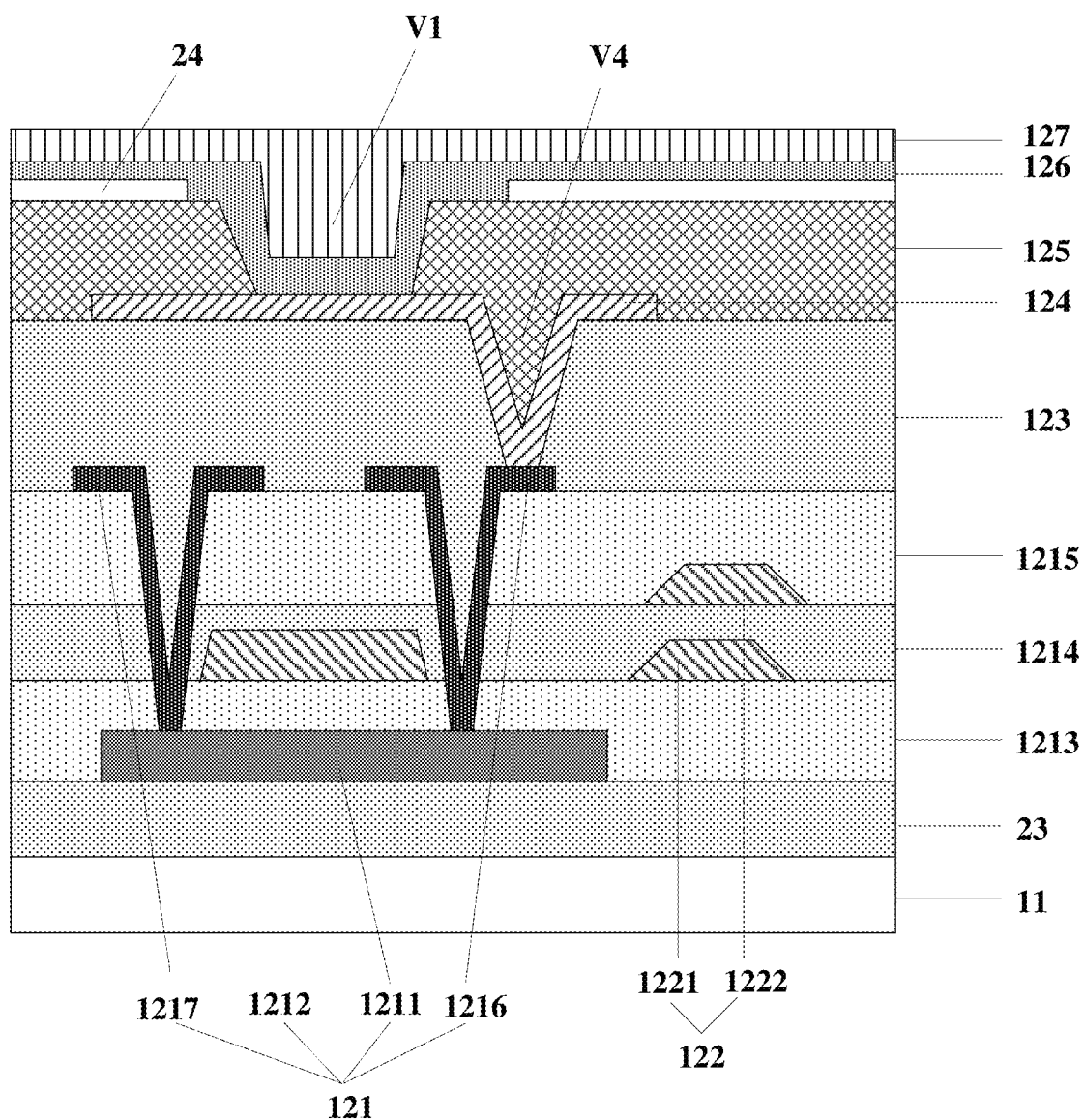
FIG. 2A is a schematic cross-sectional view showing a sub-pixel in a display panel according to an embodiment of the present disclosure.
Figure 2B:
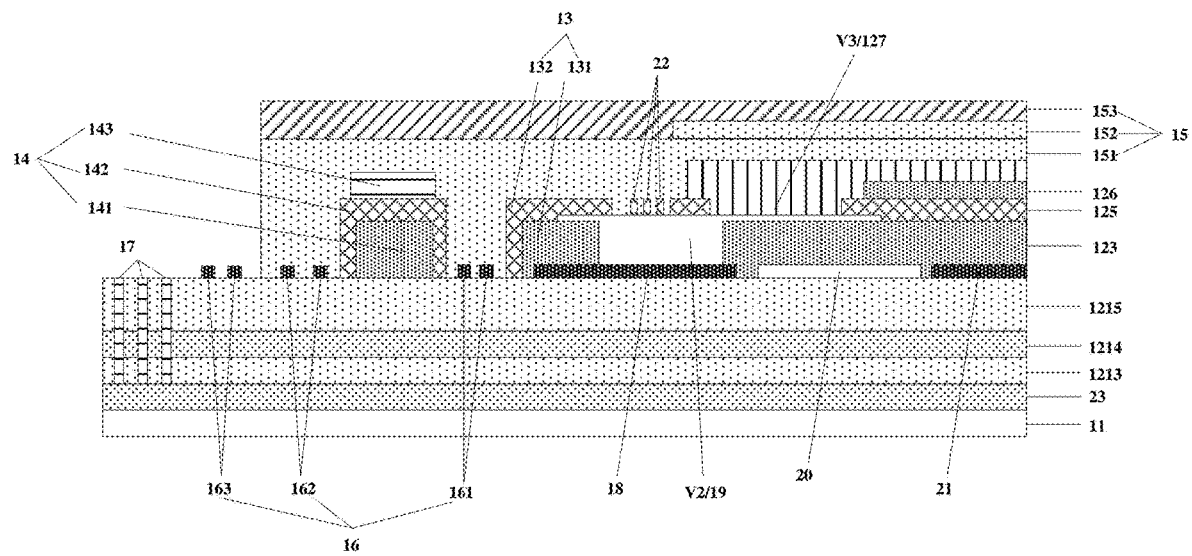
FIG. 2B is a schematic cross-sectional view showing a display panel according to an embodiment of the present disclosure.

FIG. 2A is a schematic cross-sectional view showing a sub-pixel in a display panel according to an embodiment of the present disclosure. FIG. 2B is a schematic cross-sectional view showing a display panel according to an embodiment of the present disclosure. The structure of the display panel according to some embodiments of the present disclosure will be introduced below in conjunction with FIGS. 2A and 2B.

As shown in FIG. 2A, the sub-pixel 12 comprises a driving transistor 121. Here, the driving transistor 121 comprises a plurality of conductive layers. As some implementations, the driving transistor 121 may be a top gate transistor. As other implementations, the driving transistor 121 may be a bottom gate transistor. FIG. 2A shows the driving transistor 121 as a top gate transistor.

As shown in FIG. 2B, other than the base substrate 11 and the plurality of sub-pixels 12, the display panel further comprises a first dam 13, a second dam 14, an encapsulation layer 15 and at least one pressure sensor 16. For example, the pressure sensor 16 can serve as a volume button or a power-on button.

The first dam 13 and the second dam 14 both surround the display area 111 and are located at the peripheral area 112. The second dam 14 is located on one side of the first dam 13 away from the display area 111. Here, the first dam 13 and the second dam 14 can block water and oxygen from entering the sub-pixel 12.

The encapsulation layer 15 is located on one side of the plurality of sub-pixels 12, the first dam 13 and the second dam 14 away from the base substrate 11. Here, the orthographic projections of the plurality of sub-pixels 12, the first dam 13 and the second dam 14 on the base substrate 11 are located within the orthographic projection of the encapsulation layer 15 on the base substrate 11. For example, the encapsulation layer 15 may comprise a thin film encapsulation layer. In some embodiments, the encapsulation layer 15 may comprise a first inorganic layer 151, a second inorganic layer 152, and an organic layer 153 located between the first inorganic layer 151 and the second inorganic layer 152. In some embodiments, the display panel may further comprise a third dam 22 located between the second dam 14 and the display area 111. The third dam 22 is used for blocking the flow of the organic layer 153.

At least one pressure sensor 16 is located on at least one of a first side of the second dam 14 proximate to the first dam 13 and a second side of the second dam 14 away from the first dam 13. For example, the at least one pressure sensor 16 is located on the first side of the second dam 14 proximate to the first dam 13. For another example, the at least one pressure sensor 16 is located on the second side of the second dam 14 away from the first dam 13 For still another example, one or more pressure sensors 16 of the at least one pressure sensor 16 are located on the first side of the second dam 14 proximate to the first dam 13, and one or more sensors 16 of the at least one pressure sensor 16 are located on the second side of the second dam 14 away from the first dam 13.

At least one resistor R in each pressure sensor 16 is located in a same layer as one of the plurality of conductive layers in the driving transistor 121. For example, at least one resistor R of the pressure sensor 16 comprises four resistors.

It should be noted that, in the embodiments of the present disclosure, a plurality of components is located in a same layer means that the plurality of components is formed by performing a patterning process on a same material layer. Therefore, the plurality of components has a same material, and has substantially a same thickness.

In the above embodiments, at least one pressure sensor 16 is located on at least one of the first side of the second dam 14 proximate to the first dam 13 or the second side of the second dam 14 away from the first dam 13, and at least one resistor R of each pressure sensor 16 is located in a same layer as one of the plurality of conductive layers in the driving transistor 121. With such a structure, the pressure sensor 16 can be formed in the process of forming the sub-pixel 12 without additional providing an interaction button, thereby facilitating reducing the thickness of the display panel.

In addition, the pressure sensor 16 can make full use of the space of the peripheral area 112 without additionally increasing the size of the peripheral area 112. Therefore, in some embodiments of the present disclosure, the thickness of the display panel can be reduced in a case where a narrow bezel is realized.

Some specific implementations of the driving transistor 121 will be described below in conjunction with FIG. 2A.

Referring to FIG. 2A, the driving transistor 121 comprises an active layer 1211, a gate electrode 1212, a first insulating layer 1213, a second insulating layer 1214, a third insulating layer 1215, a first electrode 1216, and a second electrode 1217. The plurality of conductive layers in the driving transistor 121 comprises a gate 1212, a first electrode 1216, and a second electrode 1217.

The active layer 1211 and the gate 1212 are located on one side of the base substrate 11. For example, the gate 1212 is located on one side of the active layer 1211 away from the base substrate 11. For example, the material of the active layer 1211 may comprise polysilicon. For example, the material of the gate electrode 1212 may comprise Mo.

The first insulating layer 1213 is located between the active layer 1211 and the gate 1212. The second insulating layer 1214 is located on one side of the active layer 1211, the gate electrode 1212 and the first insulating layer 1213 away from the base substrate 11. The third insulating layer 1215 is located on one side of the second insulating layer 1214 away from the base substrate 11. For example, the material of at least one of the first insulating layer 1213, the second insulating layer 1214, or the third insulating layer 1215 may comprise an inorganic insulating material such as silicon oxide, silicon nitride, or silicon oxynitride.

The first electrode 1216 and the second electrode 1217 are located on one side of the third insulating layer 1215 away from the base substrate 11 and electrically connected to the active layer 1211. In some embodiments, the first electrode 1216 is a drain, and the second electrode 1217 is a source. For example, the first electrode 1216 and the second electrode 1217 are electrically connected to the active layer 1211 through a via hole penetrating through the third insulating layer 1215, the second insulating layer 1214, and the first insulating layer 1213, respectively. For example, the first electrode 1216 and the second electrode 1217 may comprise a stacked layer of Ti/Al/Ti.

As some implementations, at least one resistor R of the pressure sensor 16 is located in a same layer as the gate 1212.

As other implementations, at least one resistor R of the pressure sensor 16, the first electrode 1216 and the second electrode 1217 are located in a same layer. For example, the resistor R comprises a stacked layer of Ti/Al/Ti. In this manner, the pressure sensor 16 is more sensitive to variation in resistance after an external pressure is applied.

In some embodiments, the pixel circuit in the sub-pixel 12 comprises seven transistors and one capacitor. For example, other than the driving transistor 121, the sub-pixel 12 further comprises a first switching transistor, a second switching transistor, and a third switching transistor. The first electrode of the first switching transistor is electrically connected to one of the plurality of data lines DL, the second electrode of the first switching transistor is electrically connected to the second electrode 1217 (for example, a source) of the driving transistor 121, and the gate of the first switching transistor is electrically connected to one of the plurality of gate lines GL. The first electrode of the second switching transistor is electrically connected to one of the plurality of power lines PL, the second electrode of the second switching transistor is electrically connected to the second electrode 1217 (for example, a source) of the driving transistor 122, and the gate of the second switching transistor is electrically connected to one of the plurality of light emitting control lines GCL. The first electrode of the third switching transistor is electrically connected to the first electrode 1216 (for example, a drain) of the driving transistor 121, the second electrode of the third switching transistor is electrically connected to the anode 124, and the gate of the third switching transistor is electrically connected to one of the plurality of light emitting control lines GCL.

In some embodiments, referring to FIG. 2A, the sub-pixel 12 further comprises a planarization layer 123, an anode 124, a pixel defining layer 125, a functional layer 126 and a cathode 127.

The planarization layer 123 is located on one side of the first electrode 1216, the second electrode 1217, and the third insulating layer 1215 away from the base substrate 11. For example, the material of the planarization layer 123 may comprise an organic insulating material such as PI or resin material.

The anode 124 is located on one side of the planarization layer 123 away from the base substrate 11 and electrically connected to one of the first electrode 1216 and the second electrode 1217. For example, the anode 124 is electrically connected to the first electrode 1216 through a via hole penetrating through the planarization layer 123. For example, the material of the anode 124 may comprise indium tin oxide (ITO) or the like.

The pixel defining layer 125 is located on one side of the anode 124 and the planarization layer 123 away from the base substrate 11. The pixel defining layer 125 has a first opening V1. Here, the orthographic projection of the first opening V1 on the base substrate 11 at least partially overlaps with the orthographic projection of the anode 124 on the base substrate 11. In other words, the first opening V1 exposes at least a portion of the anode 124. For example, the material of the pixel defining layer 125 may comprise an organic insulating material such as PI or resin material.

The functional layer 126 is at least partially located in the first opening V1 and located on one side of the anode 124 away from the base substrate 11. Here, the functional layer 126 comprises at least a light emitting layer, for example, an organic light emitting layer. In some embodiments, the functional layer 126 may further comprise one or more of an electron transport layer, an electron injection layer, a hole transport layer, and a hole injection layer.

The cathode 127 is at least partially located in the first opening V1 and located on one side of the functional layer 126 away from the base substrate 11. For example, the cathode 127 may extend from the display area 111 to the peripheral area 112.

In some embodiments, referring to FIG. 2B, the display panel further comprises a power bus 18 electrically connected to the cathode 127. Here, the power bus 18 is located at the peripheral area 112 and located in a same layer as the first electrode 1216 and the second electrode 1217. For example, a power signal can be applied to the cathode via the power bus 18.

The electrical connection of the cathode 127 and the power bus 18 according to some implementations of the present disclosure will be introduced below.

Referring to FIG. 2B, the planarization layer 123 has a second opening V2, and the pixel defining layer 125 further has a third opening V3. Here, the orthographic projections of the second opening V2 and the third opening V3 on the base substrate 11 are located at the peripheral area 112. For example, the second opening V2 and the third opening V3 may be holes or slots. In some embodiments, the second opening V2 and the third opening V3 may be slots arranged around the display area 111.

The display panel further comprises an electrical connection portion 19. The electrical connection portion 19 is at least partially located in the second opening V2, and in contact with the power bus 18. The cathode 127 is partially located in the third opening V3, and in contact with the electrical connection portion 19. In addition, the electrical connection portion 19 is located in a same layer as the anode 124.

In this manner, the cathode 127 is electrically connected to the power bus 18 via the electrical connection portion 19 located in a same layer as the anode 124.

In some embodiments, the display panel further comprises an initialization bus 21 located at the peripheral area 112 and electrically connected to the plurality of initialization lines IL located at the display area 111. An initialization signal can be provided to the plurality of initialization lines IL via the initialization bus 21. The initialization bus line 21 is located between the planarization layer 123 and the base substrate 11 and located in a same layer as the first electrode 1216 and the second electrode 1217. For example, the initialization bus 21 is located between the power line 13 and the display area 111.

In some embodiments, the display panel further comprises a driving circuit 20. The driving circuit 20 is located between the power bus 18 and the initialization bus 21 and located between the planarization layer 123 and the base substrate 11. In some embodiments, the driving circuit 22 may comprise a gate driving circuit and a light emitting control driving circuit. The gate driving circuit comprises a plurality of gate driving units electrically connected to the plurality of gate lines GL, for example, a plurality of cascaded first shift registers. The light emitting control driving circuit comprises a plurality of light emitting control driving units electrically connected to the plurality of light emitting control lines GCL, for example, a plurality of cascaded second shift registers.

Some specific implementations of the first dam 13 and the second dam 14 will be described below.

In some implementations, referring to FIG. 2B, the first dam 13 comprises a first layer 131 and a second layer 132 located on one side of the first layer away from the base substrate 11. The first layer 131 and the planarization layer 123 are located in a same layer, and the second layer 132 and the pixel defining layer 125 are located in a same layer. For example, the orthographic projection of the first dam 13 on the base substrate 11 partially overlaps with the orthographic projection of the power bus 18 on the base substrate 11.

In some implementations, referring to FIG. 2B, the second dam 14 comprises a third layer 141, a fourth layer 142 located on one side of the third layer 141 away from the base substrate 11, and a fifth layer 143 located on one side of the fourth layer 142 away from the base substrate 11. The third layer 141 and the planarization layer 123 are located in a same layer, the fourth layer 142 and the pixel defining layer 125 are located in a same layer, and the fifth layer 143 and the support layer 24 (see FIG. 2A) located at the display area 111 are located in a same layer. Here, the support layer 24 is located on one side of the pixel defining layer 125 away from the base substrate 11. For example, the material of the support layer 24 may comprise an organic insulating material such as PI or resin material.

In some embodiments, referring to FIG. 2B, the display panel further comprises a crack stop member 17 for preventing a crack during the process of cutting the display panel from expanding to the display area 111. Here, the crack stop member 17 is located on one side of the encapsulation layer 15 away from the display area 111, and the pressure sensor 16 in the display panel is located on one side of the crack stop member 17 proximate to the display area 111.

In some embodiments, the distance between the boundary of the orthographic projection of the first dam 13 on the base substrate 11 proximate to the second dam 14 and the boundary of the orthographic projection of the second dam 14 on the base substrate 11 proximate to the first dam 13 is a first distance, the distance between the boundary of the orthographic projection of the second dam 14 on the base substrate 11 away from the first dam 13 and the boundary of the orthographic projection of the encapsulation layer 15 on the base substrate 11 is a second distance, and the distance between the boundary of the orthographic projection of the encapsulation layer 15 on the base substrate 11 and the boundary of the orthographic projection of the crack stop member 17 on the base substrate 11 proximate to the display area 111 is a third distance. Here, the first distance and the second distance are greater than the third distance. For example, the first distance and the second distance are greater than 50 micrometers, and may be, for example, 80 micrometers, 90 micrometers, 100 micrometers, 110 micrometers, 130 micrometers, or 150 micrometers. For example, the third distance is 30 micrometers to 70 micrometers, for example 40 micrometers, 50 micrometers, 60 micrometers, etc. It should be understood that, the first distance, the second distance, and the third distance can be adjusted by those skilled in the art according to the size of the bezel of the display panel. In addition, it should also be understood that, the distance between two boundaries can be understood as a minimum distance from various points on one boundary to various points on the other boundary.

In some embodiments, referring to FIGS. 2A and 2B, the display panel further comprises a buffer layer 23 located between the base substrate 11 and the first insulating layer 1213. For example, the material of the buffer layer 23 may comprise an inorganic insulating material such as silicon oxide, silicon nitride, or silicon oxynitride. Here, the first insulating layer 1213, the second insulating layer 1214, and the third insulating layer 1215 extend from the display area 111 to the peripheral area 112, and the crack stop member 17 penetrates through the third insulating layer 1215, the second insulating layer 1214, the first insulating layer 1213 and the buffer layer 18.

For example, the display panel has one or more grooves penetrating through the third insulating layer 1215, the second insulating layer 1214, the first insulating layer 1213, and the buffer layer 18. By filling a material such as an organic material in the one or more grooves, one or more crack stop members 17 can be formed. In some embodiments, the crack stop member 17 comprises a plurality of material layers, which may be located in a same layer as one or more of the planarization layer 123, the pixel defining layer 125 and the support layer 24. For example, the crack stop member 17 comprises two material layers, one of which is located in a same layer as the planarization layer 123 and the other of which is located in a same layer as the pixel defining layer 125.

Some implementations of the position of the pressure sensor 16 in the display panel will be introduced below.

In some embodiments, referring to FIG. 2B, at least one pressure sensor 161 of the display panel comprises a first pressure sensor 161. Here, the first pressure sensor 161 is located between the second dam 14 and the first dam 13, and the orthographic projection of the first pressure sensor 16 on the base substrate 11 is located within the orthographic projection of the encapsulation layer 15 on the base substrate 11. In this manner, on one hand, the first pressure sensor 161 is covered by the encapsulation layer 15; on the other hand, the second dam 14 can prevent an adverse effect of water and oxygen on the first pressure sensor 161. Therefore, the reliability of the first pressure sensor 161 is improved.

In other embodiments, referring to FIG. 2B, at least one pressure sensor 16 of the display panel comprises a second pressure sensor 162. Here, the second pressure sensor 162 is located between the second dam 14 and the crack stop member 17, and the orthographic projection of the second pressure sensor 162 on the base substrate 11 is located within the orthographic projection of the encapsulation layer 15 on the base substrate 11. In this manner, the second pressure sensor 162 is covered by the encapsulation layer 15, an adverse effect of water and oxygen on the second pressure sensor 162 is reduced.

In still other embodiments, referring to FIG. 2B, at least one pressure sensor 16 of the display panel comprises a third pressure sensor 163 located between the encapsulation layer 15 and the crack stop member 17.

Figure 3:
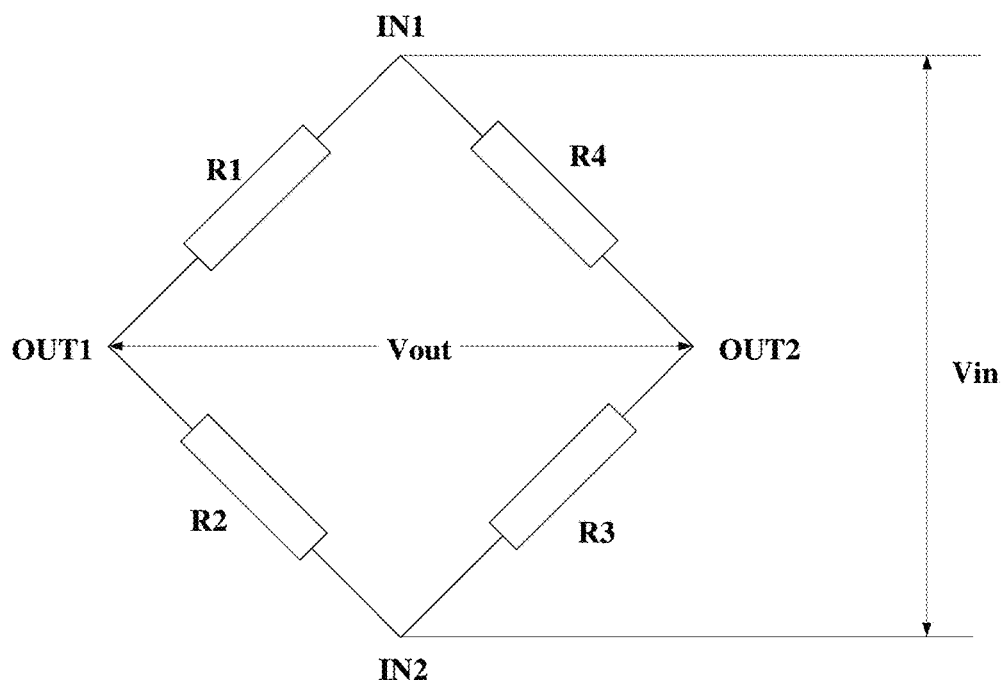
FIG. 3 is a schematic circuit view showing a pressure sensor according to an embodiment of the present disclosure.

FIG. 3 is a schematic circuit view showing a pressure sensor according to an embodiment of the present disclosure.

As shown in FIG. 3, the at least one resistor R of the display panel comprises a first resistor R1, a second resistor R2, a third resistor R3, and a fourth resistor R4.

The first resistor R1 is electrically connected between the first input terminal IN1 and the first output terminal OUT1, the second resistor R2 is electrically connected between the first output terminal OUT1 and the second input terminal IN2, the third resistor R3 is electrically connected between the second input terminal IN2 and the second output terminal OUT2, and the fourth resistor R4 is electrically connected between the second output terminal OUT2 and the first input terminal IN1. Here, the first resistor R1, the second resistor R2, the third resistor R3, and the fourth resistor R4 have a same resistance value in a case where no pressure is applied to the first resistor R1, the second resistor R2, the third resistor R3, and the fourth resistor R4. It should be understood that, "the same" here means "the same" within a tolerance range of the process of a semiconductor.

The operation principle of the pressure sensor 16 will be explained by taking that an external pressure is applied to the first resistor R1 and no external pressure is applied to the other three resistors as an example.

An input voltage Vin is applied between the first input terminal IN1 and the second input terminal IN2. In a case where no external pressure is applied, the first resistor R1, the second resistor R2, the third resistor R3, and the fourth resistor R4 have a same resistance value, and the output voltage between the first output terminal OUT1 and the second output terminal OUT2 Vout is 0; in a case where an external pressure is applied to the first resistor R1 and no external pressure is applied to the other three resistors, the resistance value of the first resistor R1 changes, and the resistance values of the other three resistors do not change. Therefore, Vout it not 0. Therefore, whether an external pressure is applied to the first resistor R1 of the pressure sensor 16 can be recognized according to the value of Vout.

For the signal input and signal output of the pressure sensor 16, the following wiring is also provided in the embodiments of the present disclosure.

Figure 4A:
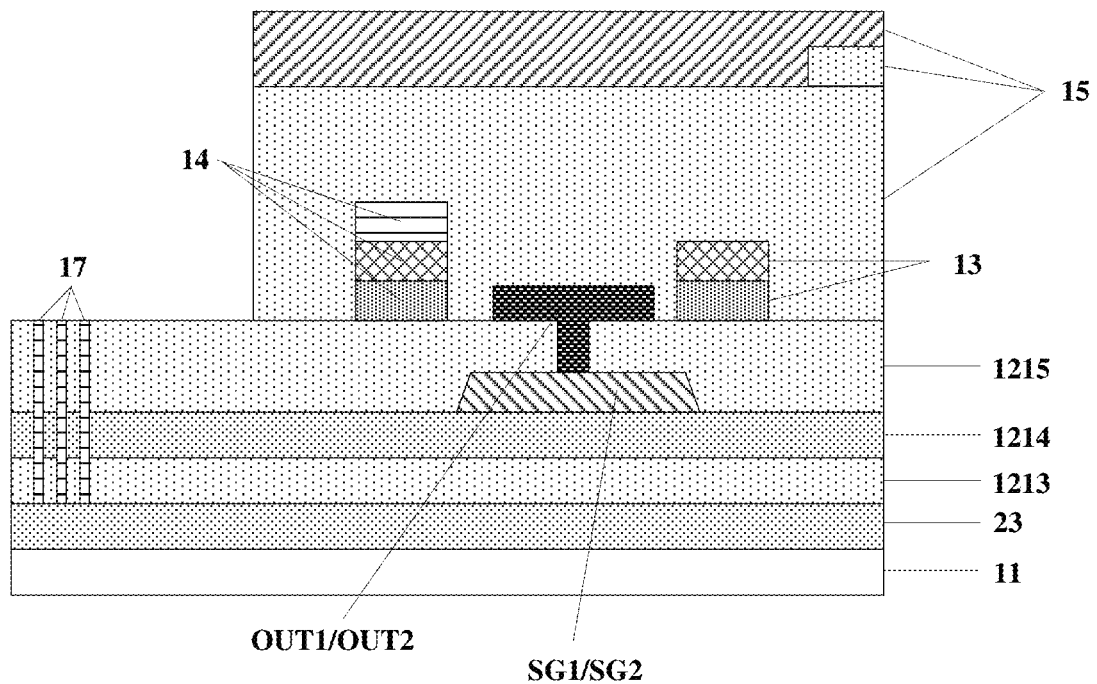
FIG. 4A is a schematic cross-sectional view showing the wiring of a pressure sensor according to an embodiment of the present disclosure.

FIG. 4A is a schematic cross-sectional view showing the wiring of a pressure sensor according to an embodiment of the present disclosure.

As shown in FIG. 4A, the display panel further comprises a first signal output line SG1 electrically connected to the first output terminal OUT1 and a second signal output line SG2 electrically connected to the second output terminal OUT2. It should be noted that, the manner of electrical connection of the first output terminal OUT1 and the first signal output line SG1 is similar to the manner of electrical connection of the second output terminal OUT2 and the second signal output line SG2. In a case where the output terminal shown in FIG. 4A is the first output terminal OUT1, the signal line shown in FIG. 4A is the first signal output line SG1; in a case where the output terminal shown in FIG. 4A is the second output terminal OUT2, the signal line shown in FIG. 4A is the second signal output line SG2.

The first signal output line SG1 and the second signal output line SG2 may be located in a same layer as a certain layer in the sub-pixel 12, which will be described below in conjunction with FIGS. 2A and 4A.

Referring to FIG. 2A, the sub-pixel 12 further comprises a storage capacitor 122. The storage capacitor 122 comprises a first electrode plate 1221 located in a same layer as the gate 1212, and a second electrode plate 1222 located between the second insulating layer 1214 and the third insulating layer 1215. It should be understood that, the storage capacitor 122 further comprises the second insulating layer 1214 located between the first electrode plate 1221 and the second electrode plate 1222.

In some embodiments, the first signal output line SG1 and the second signal output line SG2 are located in a same layer as one of the first electrode plate 1221 and the second electrode plate 1222.

For example, the first signal output line SG1 and the second signal output line SG2 are located in a same layer as the first electrode plate 1221. In this case, the first output terminal OUT1 may be electrically connected to the first signal output line SG1 through one or more via holes penetrating through the third insulating layer 1215 and the second insulating layer 1214, and the second output terminal OUT2 may be electrically connected to the second signal output line SG2 through one or more via holes penetrating through the third insulating layer 1215 and the second insulating layer 1214.

For another example, referring to FIG. 4A, the first signal output line SG1 and the second signal output line SG2 are located in a same layer as the second electrode plate 1222. In this case, the first output terminal OUT1 may be electrically connected to the first signal output line SG1 through one or more via holes penetrating through the third insulating layer 1215, and the second output terminal OUT2 may be electrically connected to the second signal output line SG2 through one or more via holes penetrating through the third insulating layer 1215.

Figure 4B:
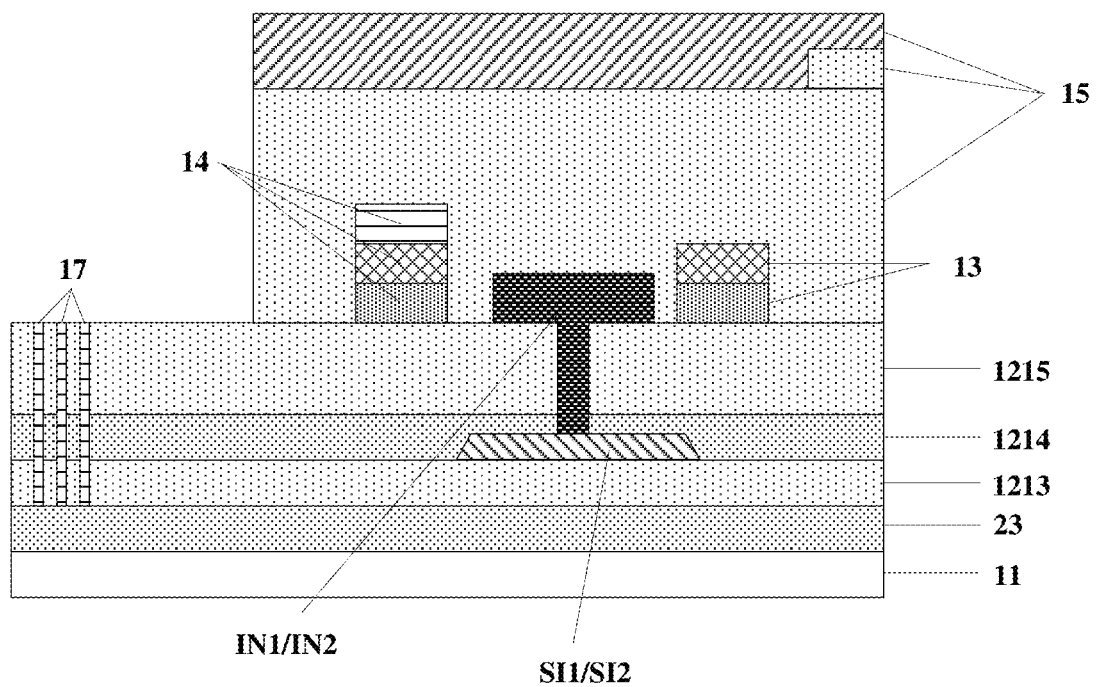
FIG. 4B is a schematic cross-sectional view showing the wiring of a pressure sensor according to another embodiment of the present disclosure.

FIG. 4B is a schematic cross-sectional view showing the wiring of a pressure sensor according to another embodiment of the present disclosure.

As shown in FIG. 4B, the display panel further comprises a first signal input line SI1 electrically connected to the first input terminal IN1, and a second signal input line SI2 electrically connected to the second input terminal IN2. It should be noted that, the manner of electrical connection of the first input terminal IN1 and the first signal input line SI1 is similar to the manner of electrical connection of the second input terminal IN2 and the second signal input line SI2. In a case where the input terminal shown in FIG. 4B is the first input terminal IN1, the signal line shown in FIG. 4B is the first signal input line SI1; in a case where the input terminal shown in FIG. 4B is the second input terminal IN2, the signal line shown in FIG. 4B is the second signal input line SI2.

In the case where the first signal output line SG1 and the second signal output line SG2 are located in a same layer as one of the first electrode plate 1221 and the second electrode plate 1222, the first signal input line SI1 and the second signal input line SI2 are located in a same layer as the other of the first electrode plate 1221 and the second electrode plate 1222. In other words, the two signal output lines SG1 and SG2 are located in different layers from the two signal input lines SI1 and SI2.

For example, referring to FIG. 4B, the first signal input line SI1 and the second signal input line SI2 are located in a same layer as the first electrode plate 1221. For example, the first input terminal IN1 may be electrically connected to the first signal input line SI1 through one or more via holes penetrating through the third insulating layer 1215 and the second insulating layer 1214, and the second input terminal IN2 may be electrically connected to the second signal input line IG2 through one or more via holes penetrating through the third insulating layer 1215 and the second insulating layer 1214.

In this way, the signal interference between the two signal output lines SG1 and SG2 and the two signal input lines SI1 and SI2 can be reduced.

Figure 5A:
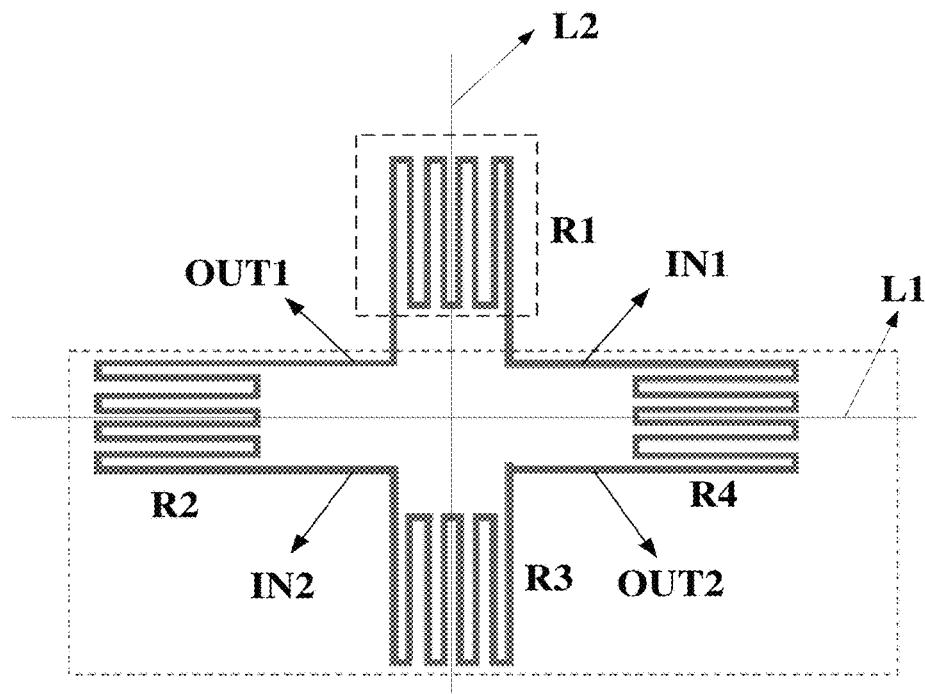
FIGS. 5A and 5B are schematic views showing the layout of a pressure sensor according to some embodiments of the present disclosure.
Figure 5B:
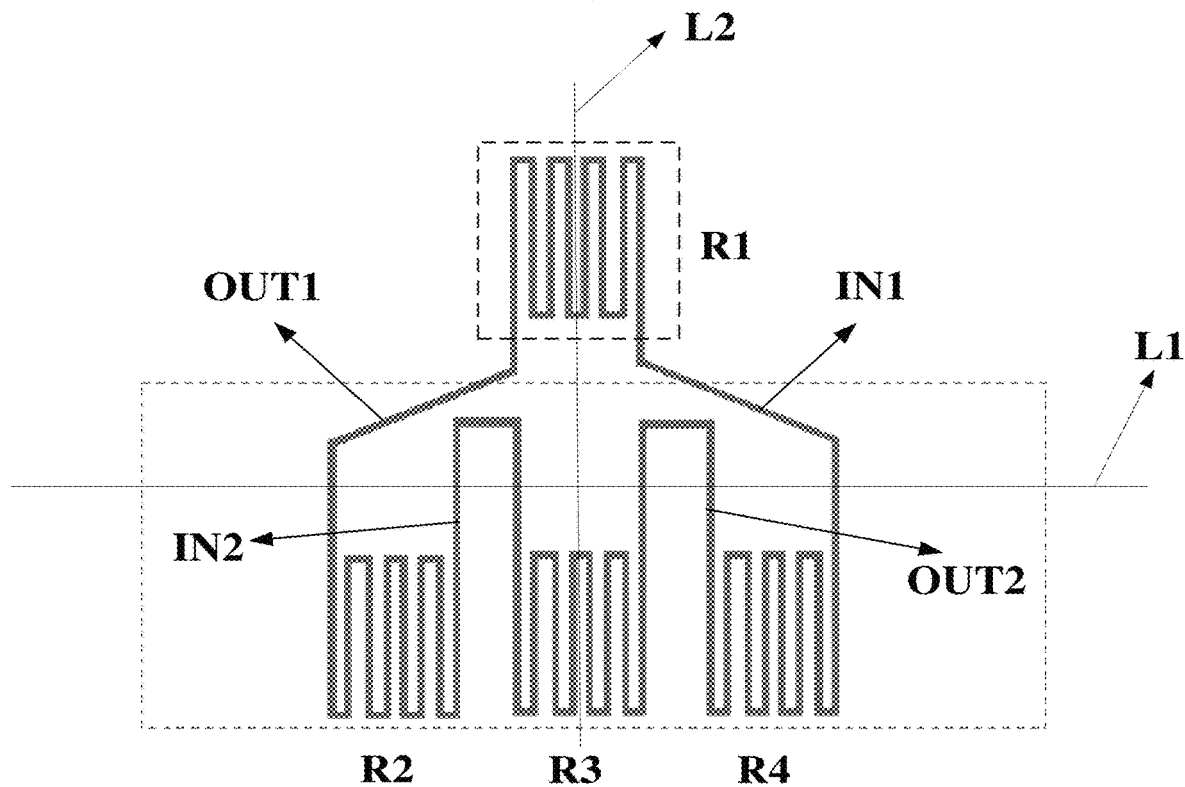

FIGS. 5A and 5B are schematic views showing the layout of a pressure sensor according to some embodiments of the present disclosure.

In FIGS. 5A and 5B, the first resistor R1 and the third resistor R3 are arranged symmetrically with respect to the first line L1, and the second resistor R2 and the fourth resistor R4 are arranged symmetrically with respect to the second line L2. For example, the first line L1 is perpendicular to the second line L2.

In some embodiments, referring to FIG. 5B, the first resistor R1 is located on one side of the first line L1, and the second resistor R2, the third resistor R3, and the fourth resistor R4 are located on the other side of the first line L1. In this way, it is more easily to arrange the four resistors so that the first resistor R1 is subjected to an external pressure, while the other three resistors are not subjected to an external pressure.

In addition, FIGS. 5A and 5B schematically show the positions of the first input terminal IN1, the second input terminal IN2, the first output terminal OUT1, and the second output terminal OUT2.

Figure 6:
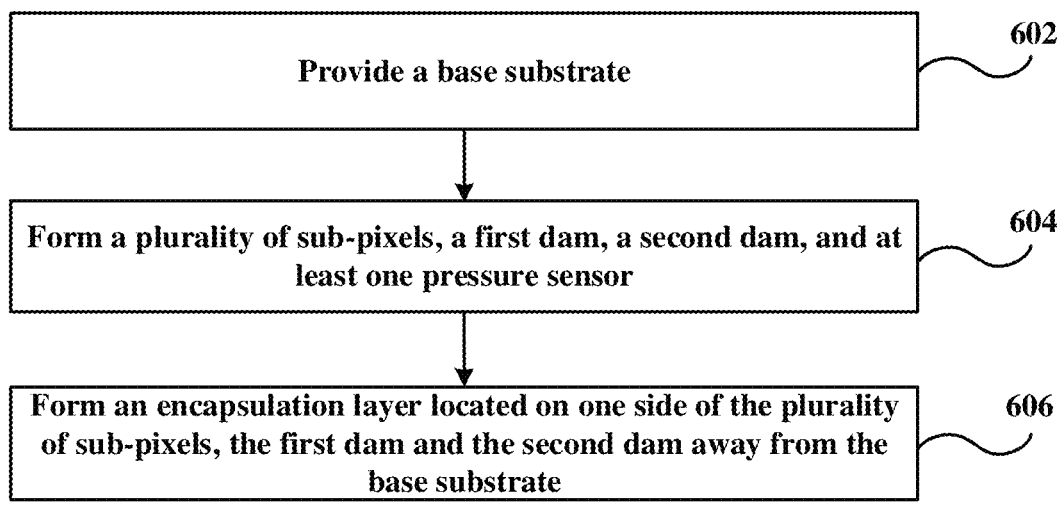
FIG. 6 is a schematic flowchart showing a manufacturing method of a display panel according to an embodiment of the present disclosure.

FIG. 6 is a schematic flowchart showing a manufacturing method of a display panel according to an embodiment of the present disclosure.

At step 602, a base substrate is provided. The base substrate comprises a display area and a peripheral area surrounding the display area.

At step 604, a plurality of sub-pixels, a first dam, a second dam, and at least one pressure sensor are formed. For example, during the process of forming a sub-pixel, the first dam, the second dam, and the pressure sensor may be formed at the same time.

The plurality of sub-pixels is located at the display area. At least one of the plurality of sub-pixels comprises a driving transistor comprising a plurality of conductive layers.

The first dam and the second dam are located at the peripheral area and surround the display area, and the second dam is located on one side of the first dam away from the display area.

At least one pressure sensor is located on at least one of the first side of the second dam proximate to the first dam and the second side of the second dam away from the first dam. At least one resistor in each of the at least one pressure sensor is located in a same layer as one of the plurality of conductive layers.

At step 606, an encapsulation layer located on one side of the plurality of sub-pixels, the first dam and the second dam away from the base substrate is formed.

Here, the orthographic projections of the plurality of sub-pixels, the first dam and the second dam on the base substrate are located within the orthographic projection of the encapsulation layer on the base substrate.

In the above embodiments, at least one pressure sensor is located on at least one of the first side of the second dam proximate to the first dam and the second side of the second dam away from the first dam, and at least one resistance R in each pressure sensor is located in a same layer as one of the plurality of conductive layers in the driving transistor. With such a structure, the pressure sensor can be formed during the process of forming a sub-pixel without additionally providing an interaction button, thereby facilitating reducing the thickness of the display panel.

The present disclosure also provides a display device, which may comprise the display panel according to any one of the above embodiments. In some embodiments, the display device may be, for example, any product or component with a display function, such as a mobile terminal, a television, a monitor, a notebook computer, a digital photo edge, a navigator, or an electronic paper.

For example, the display device is a mobile terminal. In some embodiments, the bezel on one side of the mobile terminal is designed so that an external pressure can be applied to the first resistor R1 in the pressure sensor 16 of the display panel, while an external pressure cannot be applied to the other three resistors, thus making the output voltage Vout of the pressure sensor 16 change.

Hereto, various embodiments of the present disclosure have been described in detail. Some details well known in the art are not described to avoid obscuring the concept of the present disclosure. According to the above description, those skilled in the art would fully know how to implement the technical solutions disclosed herein.

Although some specific embodiments of the present disclosure have been described in detail by way of examples, those skilled in the art should understand that the above examples are only for the purpose of illustration and are not intended to limit the scope of the present disclosure. It should be understood by those skilled in the art that modifications to the above embodiments and equivalently substitution of part of the technical features can be made without departing from the scope and spirit of the present disclosure. The scope of the disclosure is defined by the following claims.

What is claimed is:

1. A display panel, comprising:
a base substrate comprising a display area and a peripheral area surrounding the display area;
a plurality of sub-pixels located at the display area, wherein at least one sub-pixel of the plurality of sub-pixels comprises a driving transistor comprising a plurality of conductive layers;
a first dam surrounding the display area and located at the peripheral area;
a second dam surrounding the display area, located at the peripheral area and located on one side of the first dam away from the display area;
an encapsulation layer located on one side of the plurality of sub-pixels, the first dam, and the second dam away from the base substrate, wherein orthographic projections of the plurality of sub-pixels, the first dam, and the second dam on the base substrate are located within an orthographic projection of the encapsulation layer on the base substrate; and
at least one pressure sensor located on at least one of a first side of the second dam proximate to the first dam or a second side of the second dam away from the first dam, wherein at least one resistor in each of the at least one pressure sensor is located in a same layer as one of the plurality of conductive layers.

2. The display panel according to claim 1, wherein the driving transistor comprises:
an active layer and a gate which are located on one side of the base substrate;
a first insulating layer located between the active layer and the gate;
a second insulating layer located on one side of the active layer, the gate and the first insulating layer away from the base substrate;
a third insulating layer located on one side of the second insulating layer away from the base substrate; and
a first electrode and a second electrode which are located on one side of the third insulating layer away from the base substrate and electrically connected to the active layer,
wherein the plurality of conductive layers comprises the gate, the first electrode and the second electrode, and the at least one resistor, the first electrode and the second electrode are located in a same layer.

3. The display panel according to claim 2, wherein:
the at least one sub-pixel further comprises a storage capacitor comprising:
a first electrode plate located in a same layer as the gate, and
a second electrode plate located between the second insulating layer and the third insulating layer;
the at least one resistor comprises a first resistor electrically connected between a first input terminal and a first output terminal, a second resistor electrically connected between the first output terminal and a second input terminal, a third resistor electrically connected between the second input terminal and a second output terminal, and a fourth resistor electrically connected between the second output terminal and the first input terminal, wherein the first resistor, the second resistor, the third resistor and the fourth resistor are of a same resistance value in a case where no pressure is applied the first resistor, the second resistor, the third resistor and the fourth resistor; and
the display panel further comprises a first signal output line electrically connected to the first output terminal and a second signal output line electrically connected to the second output terminal, wherein the first signal output line and the second signal output line are located in a same layer as one of the first electrode plate and the second electrode plate.

4. The display panel according to claim 3, wherein the first signal output line and the second signal output line are located in a same layer as the second electrode plate.

5. The display panel according to claim 3, further comprising:
a first signal input line electrically connected to the first input terminal; and
a second signal input line electrically connected to the second input terminal, wherein the first signal input line and the second signal input line are located in a same layer as the other of the first electrode plate and the second electrode plate.

6. The display panel according to claim 5, wherein the first resistance and the third resistance are arranged symmetrically with respect to a first line, and the second resistance and the fourth resistance are arranged symmetrically with respect to a second line.

7. The display panel according to claim 6, wherein the first line is perpendicular to the second line.

8. The display panel according to claim 7, wherein the first resistor is located on one side of the first line, and the second resistor, the third resistor, and the fourth resistor are located on the other side of the first line.

9. The display panel according to claim 1, further comprising:
a crack stop member located on one side of the encapsulation layer away from the display area, wherein the at least one pressure sensor is located on one side of the crack stop member proximate to the display area.

10. The display panel according to claim 9, wherein the at least one pressure sensor comprises:
a first pressure sensor located between the second dam and the first dam, wherein an orthographic projection of the first pressure sensor on the base substrate is located within the orthographic projection of the encapsulation layer on the base substrate.

11. The display panel according to claim 9, wherein the at least one pressure sensor comprises:
a second pressure sensor located between the second dam and the crack stop member, wherein an orthographic projection of the second pressure sensor on the base substrate is located within the orthographic projection of the encapsulation layer on the base substrate.

12. The display panel according to claim 9, wherein the at least one pressure sensor comprises:
a third pressure sensor located between the encapsulation layer and the crack stop member.

13. The display panel according to claim 9, further comprising a buffer layer located between the base substrate and the first insulating layer, wherein:
the first insulating layer, the second insulating layer, the third insulating layer, and the buffer layer extend from the display area to the peripheral area, and
the crack stop member penetrates through the third insulating layer, the second insulating layer, the first insulating layer, and the buffer layer.

14. The display panel according to claim 2, wherein:
the at least one sub-pixel further comprises:
a planarization layer located on one side of the first electrode, the second electrode and the third insulating layer away from the base substrate,
an anode located on one side of the planarization layer away from the base substrate and electrically connected to one of the first electrode and the second electrode,
a pixel defining layer located on one side of the anode and the planarization layer away from the base substrate, and having a first opening, wherein an orthographic projection of the first opening on the base substrate at least partially overlaps with an orthographic projection of the anode on the base substrate,
a functional layer at least partially located in the first opening and located on one side of the anode away from the base substrate, and
a cathode at least partially located in the first opening and located on one side of the functional layer away from the base substrate; and
the display panel further comprises a power bus located at the peripheral area, electrically connected to the cathode, and located in a same layer as the first electrode and the second electrode.

15. The display panel according to claim 14, wherein:
the planarization layer has a second opening, the pixel defining layer further has a third opening, orthographic projections of the second opening and the third opening on the base substrate being located at the peripheral area;
the display panel further comprises an electrical connection portion at least partially located in the second opening, located in a same layer as the anode, and in contact with the power bus; and
the cathode is partially located in the third opening, and in contact with the electrical connection portion.

16. The display panel according to claim 14, further comprising:
a plurality of initialization lines located at the display area, electrically connected to the plurality of sub-pixels, and configured to provide an initialization signal to the plurality of sub-pixels; and
an initialization bus located at the peripheral area, located between the planarization layer and the base substrate, electrically connected to the plurality of initialization lines, and located in a same layer as the first electrode and the second electrode.

17. The display panel according to claim 14, wherein the first dam comprises:
a first layer located in a same layer as the planarization layer; and
a second layer located on one side of the first layer away from the base substrate and located in a same layer as the pixel defining layer.

18. The display panel according to claim 14, wherein the second dam comprises:
a third layer located in a same layer as the planarization layer;
a fourth layer located on one side of the third layer away from the base substrate, and located in a same layer as the pixel defining layer; and
a fifth layer located on one side of the fourth layer away from the base substrate and located in a same layer as a support layer, wherein the support layer is located at the display area and located on one side of the pixel defining layer away from the base substrate.

19. A display device, comprising the display panel according to claim 1.

20. A manufacturing method of a display panel, comprising:
providing a base substrate comprising a display area and a peripheral area surrounding the display area;
forming a plurality of sub-pixels, a first dam, a second dam and at least one pressure sensor, wherein:
the plurality of sub-pixels is located at the display area, and at least one sub-pixel of the plurality of sub-pixels comprises a driving transistor comprising a plurality of conductive layers,
the first dam and the second dam are located at the peripheral area and surround the display area, and the second dam is located on one side of the first dam away from the display area, and
the at least one pressure sensor is located on at least one of a first side of the second dam proximate to the first dam or a second side of the second dam away from the first dam, wherein at least one resistor in each of the at least one pressure sensor is located in a same layer as one of the plurality of conductive layers; and
forming an encapsulation layer located on one side of the plurality of sub-pixels, the first dam, and the second dam away from the base substrate, wherein orthographic projections of the plurality of sub-pixels, the first dam, and the second dam on the base substrate are located within an orthographic projection of the encapsulation layer on the base substrate.

* * * * *